United States Patent [19]

Tsubone

[11] Patent Number: 5,100,820
[45] Date of Patent: Mar. 31, 1992

[54] MOSFET FABRICATION PROCESS WITH LIGHTLY-DOPED DRAIN USING LOCAL OXIDATION STEP TO PATTERN GATE ELECTRODE

[75] Inventor: Ko Tsubone, Tokyo, Japan

[73] Assignee: Oki Electric Industry Co., Ltd., Tokyo, Japan

[21] Appl. No.: 711,035

[22] Filed: Jun. 6, 1991

[30] Foreign Application Priority Data

Jun. 14, 1990 [JP] Japan ............... 2-153984

[51] Int. Cl.$^5$ ......................................... H01L 21/336
[52] U.S. Cl. .................................. 437/44; 437/69; 437/233; 357/23.3
[58] Field of Search .............. 437/27, 28, 29, 30, 437/40, 41, 69, 186, 233; 357/23.3; 148/DIG. 117

[56] References Cited

U.S. PATENT DOCUMENTS

| Re. 32,800 | 12/1988 | Han et al. | 437/44 |
| 4,160,987 | 7/1979 | Dennard et al. | 437/69 |
| 4,503,601 | 3/1985 | Chiao | 437/44 |
| 4,520,553 | 6/1985 | Kraft | 437/69 |
| 4,616,399 | 10/1986 | Ooka | 437/44 |
| 4,622,096 | 11/1986 | Dil et al. | 437/69 |
| 4,775,644 | 10/1988 | Szeto | 437/69 |
| 4,786,609 | 11/1988 | Chen | 437/44 |

FOREIGN PATENT DOCUMENTS

| 0072331 | 5/1982 | Japan | 437/233 |
| 0193062 | 11/1982 | Japan | 437/233 |
| 0132978 | 8/1983 | Japan | 437/44 |
| 0157137 | 9/1983 | Japan | 437/233 |
| 0158970 | 9/1983 | Japan | 437/44 |
| 0220971 | 12/1984 | Japan | 437/44 |
| 0034068 | 2/1985 | Japan | 437/44 |
| 0131576 | 6/1988 | Japan | 437/233 |
| 0143357 | 6/1989 | Japan | 357/23.3 |

OTHER PUBLICATIONS

R. Izawa et al.; "The Impact of Gate-Drain Overlapped LDD (Gold) for Deep Submicron VLSI'S"; 1987 IEDM Technical Digest, pp. 38–41.

Primary Examiner—Olik Chaudhuri
Assistant Examiner—M. Wilczewski
Attorney, Agent, or Firm—Spencer & Frank

[57] ABSTRACT

A gate oxide layer, a polysilicon layer, and an oxidation-resistant layer are formed in sequence on a semiconductor substrate, the oxidation-resistant layer is patterned, then high-pressure oxidation is performed, oxidizing at least part of the polysilicon layer not covered by the oxidation-resistant layer and leaving, under the oxidation-resistant layer, a polysilicon gate electrode with tapered sides. The oxidized portions of the polysilicon layer are removed and two ion implantation steps are carried out with different accelerating energies and impurity doses, one step creating heavily-doped source and drain areas, the other step creating lightly-doped offset layers. The lightly-doped offset layers are at least partially located under the tapered sides of the gate electrode.

13 Claims, 10 Drawing Sheets

PRIOR ART

MOSFET FABRICATION PROCESS WITH LIGHTLY-DOPED DRAIN USING LOCAL OXIDATION STEP TO PATTERN GATE ELECTRODE

BACKGROUND OF THE INVENTION

This invention relates to a process for fabricating metal-oxide-semiconductor field-effect transistors (MOSFETs) having a lightly-doped drain (LDD) structure.

The minimum size of conventional MOSFETs is limited by degradation caused by hot carriers, which are generated by peak electric fields occurring near the channel-drain boundary, particularly when the transistor operates in the saturation region. Such hot carriers become trapped in the gate oxide layer, significantly shortening the lifetime of transistors with minimum dimensions below 1.5 $\mu$m. Solutions to this problem have been sought in a variety of lightly-doped drain structures in which a lightly-doped offset area is provided between the channel and the more heavily-doped drain, the offset serving to reduce the peak electric field during transistor operation.

One well-known method of forming a lightly-doped drain first creates the lightly-doped offset area by a doping step performed with the gate electrode as a mask, then adds oxide sidewall spacers to the gate electrode and performs a second doping step at a higher dose to create the source and drain. This method has the disadvantage of increasing the minimum separation between the heavily-doped source and drain by an amount equal to the thickness of the sidewalls, thus enlarging the size of the transistor and reducing its transconductance ($g_m$). An additional problem is that doping levels adequate to avoid unwanted resistance in the offset area are too high to eliminate the problem of electric field peaking near the interface between the drain offset and the channel.

A second method known as the double-diffused drain implants first phosphorus then arsenic with the gate electrode as a mask. Subsequent heat treatment causes the two impurities to diffuse and create a lightly-doped offset with a graded doping profile, which tends to avoid peaking of the electric field. Diffusion of phosphorus from the edges of the gate, however, leads to well-known short-channel effects, making channel lengths shorter than about 1.5 $\mu$m difficult to attain.

A third method, disclosed in Japanese Patent Application Kokai Publication No. 127761/1985, employs a tungsten-silicide gate having tapered sides, which are created by an oxidation step performed at atmospheric pressure. Heavily-doped and lightly-doped source and drain areas are formed in a single high-energy arsenic ion implantation step, the lightly-doped areas being disposed under the tapered sides of the gate electrodes. This method has the disadvantage that the high energy needed to implant arsenic ions through the tapered sides of the gate electrode also drives arsenic deeply into the heavily-doped source and drain regions. As a result, extra isolation is required between adjacent transistors, so it is difficult to create densely integrated devices. Another disadvantage is that tapering reduces the cross-sectional area of the gate electrode, thereby increasing the gate resistance.

A fourth method, disclosed in Japanese Patent Application Kokai Publication No. 170064/1986, employs a tapered polysilicon gate. Otherwise, this method is similar to the third method and suffers from the same disadvantages.

A fifth method, disclosed in the 1987 IEDM Technical Digest published by the Institute of Electrical and Electronics Engineers, pp. 38–41, etches a polysilicon gate electrode into an inverted T-shape, creates lightly-doped regions below the horizontal ends of the inverted T, then adds sidewalls and creates heavily-doped source and drain areas. The result is a gate-drain overlapped LDD structure that has been named the GOLD structure. A disadvantage of the fifth method is the difficulty of controlling the etching process that shapes the polysilicon gate.

SUMMARY OF THE INVENTION

It is an object of the present invention to reduce MOSFET size.

Another object of the invention is to form MOSFETs that can be densely integrated.

Still another object of the invention is to optimize the doping of both lightly- and heavily-doped drain areas.

Yet another object of the invention is to create a reliable T-shaped gate electrode.

A further object of the invention is to avoid hot-carrier degradation without sacrificing transistor performance.

A MOSFET fabrication process comprises steps of forming a gate oxide layer on a semiconductor substrate, a polysilicon layer over the gate oxide layer, and an oxidation-resistant layer over the polysilicon layer. The oxidation-resistant layer is patterned to define a gate electrode area, then high-pressure oxidation is performed, oxidizing at least part of the polysilicon layer not covered by the oxidation-resistant layer and leaving, under the oxidation-reistant pattern, a polysilicon gate electrode with tapered sides. Next the oxidized portions of the polysilicon layer are removed and first impurity ions are implanted with the oxidation-resistant layer as a mask.

In a first aspect of the invention, the first impurity implantation forms a heavily-doped source and drain. Next the oxidation-resistant layer is removed, then second impurity ions are implanted at a higher accelerating energy and lower dose to form lightly-doped offset areas under the tapered sides of the gate electrode.

In a second aspect of the invention, the first impurity implantation forms the lightly-doped offset layer. Next oxide sidewalls are formed adjacent the tapered sides of the gate electrode, then second impurity ions are implanted at a lower accelerating energy and higher dose to form a heavily-doped source and drain.

DETAILED DESCRIPTION OF THE INVENTION

Two embodiments of the invention will be described with reference to the drawings. These embodiments will show the fabrication of an n-channel MOS transistor, but it will be apparent that the invention is equally applicable to p-channel MOS transistors, and to the fabrication of CMOS devices having both n-channel and p-channel MOS transistors. The scope of the invention should be determined not from the described embodiments but from the appended claims.

The embodiments will employ well-known semiconductor fabrication techniques such as local oxidation, chemical vapor deposition (CVD), photolithography, ion implantation, and reactive ion etching, detailed accounts of which will be omitted.

The first embodiment comprises the series of steps illustrated in FIGS. 1A to 1J. During the description of these steps, reference will also be made to FIGS. 2 to 4.

Figure 1A:
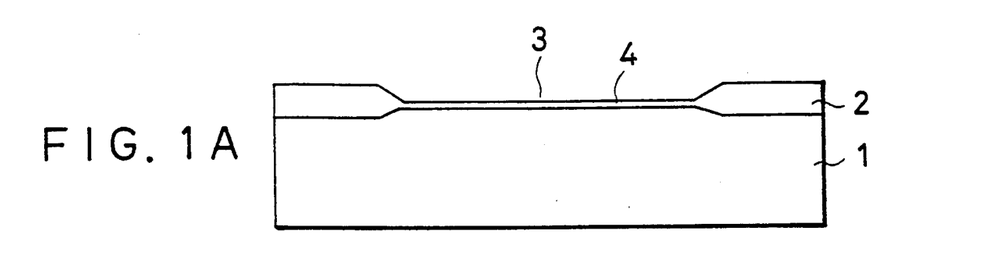
FIGS. 1A to 1J are sectional drawings illustrating steps in a first embodiment of the invention.

The first step, illustrated in FIG. 1A, is the local oxidation of a p-type silicon substrate 1 having a (100) crystal orientation and a resistivity of 3.5 Ω·cm to form a field oxide layer 2 of considerable thickness, such as 7000 angstroms. Areas not covered by the field oxide layer 2 are left as element formation areas 3. A gate oxide 4 substantially 200 angstroms thick is formed on the surface of the element formation areas 3 by heat treatment at substantially 950° C. in an oxygen ($O_2$) atmosphere.

Only one element formation area 3 is shown in the drawings, but normally many such areas are created on a single substrate, the steps described below being carried out simultaneously on all element formation areas 3.

Figures 1B, 1C:
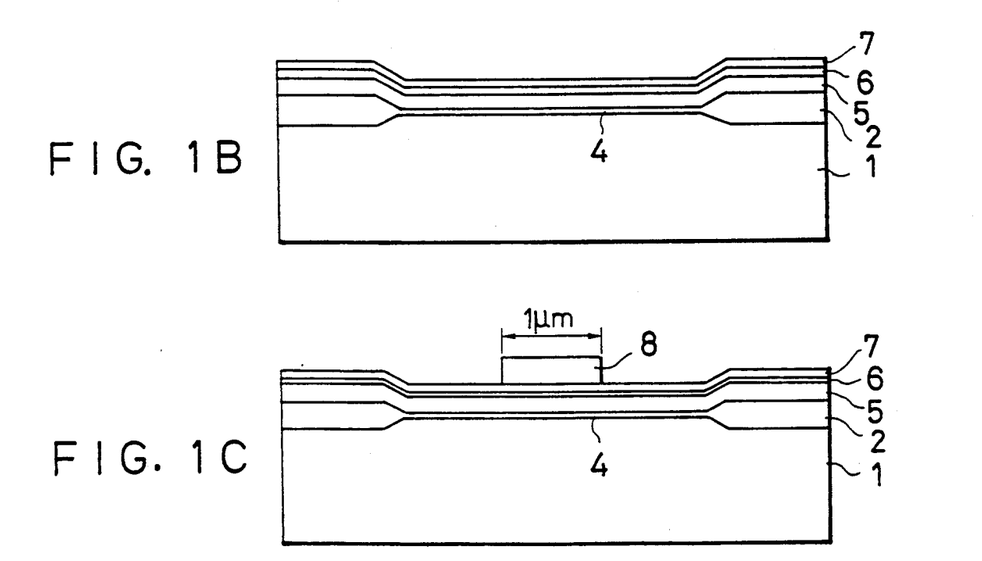

In the next step, illustrated in FIG. 1B, a polysilicon layer 5 substantially 3000 angstroms thick is formed by low-pressure CVD on the entire surface of the substrate 1, overlying the gate oxide 4. The polysilicon layer 5 is then doped with phosphorus by diffusion deposition in an atmosphere of $POCl_3+N_2+O_2$ at substantially 900° C. Then an oxide layer 6 substantially 200 angstroms thick is formed by oxidizing part of the surface of the polysilicon layer 5 at substantially 900° C. in an oxygen atmosphere, and an oxidation-resistant layer such as a silicon nitride ($Si_3N_4$) layer 7 substantially 3000 angstroms thick is formed over the polysilicon layer 5 by low-pressure CVD.

In the next step, illustrated in FIG. 1C, the entire surface is coated with a positive resist, which is patterned by photolithography to leave a resist pattern 8. The size of the resist pattern 8 is normally as small as permitted by the resolution of the photolithography process, the limiting dimension being referred to as the design rule. The drawing illustrates a design rule of one micrometer (1 μm).

Figure 1D:
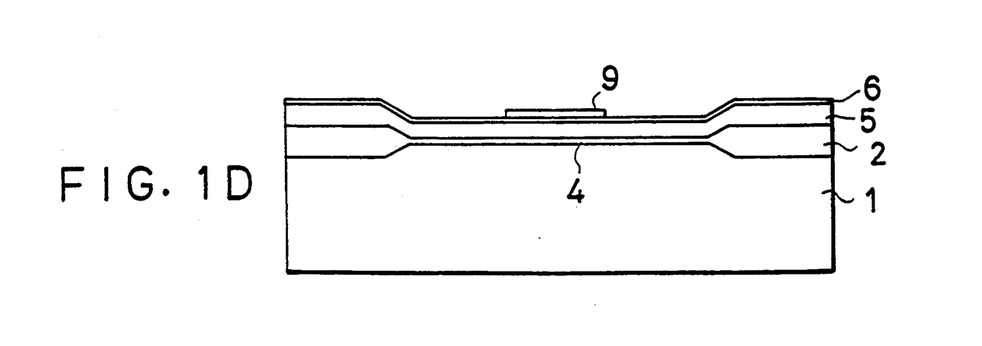

In the next step, illustrated in FIG. 1D, the $Si_3N_4$ layer 7 is removed by etching from portions of the surface not covered by the resist pattern 8, after which the resist pattern 8 itself is removed, leaving an oxidation-resistant $Si_3N_4$ pattern 9 in its place. The $Si_3N_4$ pattern 9 defines regions in which a gate electrode will be formed.

Figure 1E:
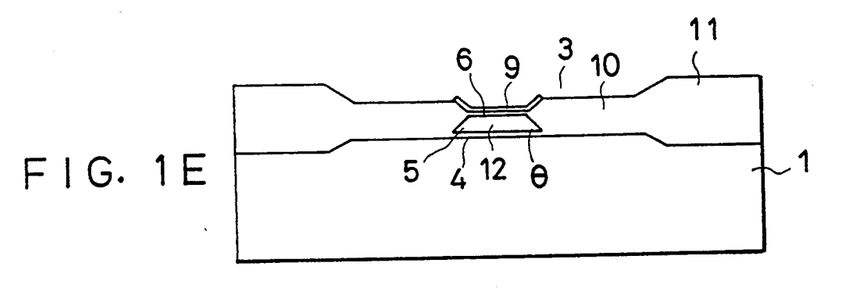

In the next step, illustrated in FIG. 1E, high-pressure oxidation is carried out in a wet oxygen atmosphere at a pressure of substantially seven atmospheres (7 kg/cm$^2$) and temperature of substantially 950° C. for substantially forty minutes, converting all the layers formed so far to a single oxide layer of expanded thickness, except where masked by the $Si_3N_4$ pattern 9. More specifically, an oxide layer 10 substantially 8000 angstroms thick is created in those parts of the element formation area 3 not masked by the $Si_3N_4$ pattern 9, and an oxide layer 11 substantially 14,500 angstroms thick is created in the field areas where the field oxide 2 was formed earlier. The polysilicon layer 5 beneath the central part of the $Si_3N_4$ pattern 9 is left unoxidized, forming a polysilicon gate electrode 12, but oxygen diffusing in at the sides of the $Si_3N_4$ pattern 9 selectively oxidizes the polysilicon layer 5, creating a so-called bird's-beak extension of the oxide layer 10 under the $Si_3N_4$ pattern 9. The polysilicon gate electrode 12 accordingly has tapered sides. The bird's-beak also raises the edges of the $Si_3N_4$ pattern 9 as shown in the drawing.

In experiments performed by the inventor, high-pressure oxidation produced an oxidation angle $\theta$ of substantially 45°. Since the polysilicon layer has a thickness of 0.3 μm, oxidation proceeds to a point substantially 0.3 μm inward from the edge of the $Si_3N_4$ pattern 9. With reference to the enlarged sectional view in FIG. 2, the polysilicon gate electrode 12 has the shape of a trapezoid with top and bottom widths of 0.4 μm and 1.0 μm and a height of 0.3 μm. The cross-sectional area of the gate electrode is accordingly 0.21 μm$^2$.

Figure 2:
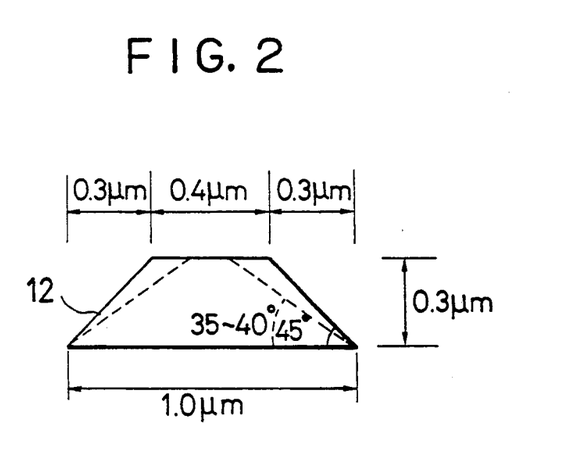
FIG. 2 is a sectional view of the gate electrode in the first embodiment.

If selective oxidation of the polysilicon is carried out at normal atmospheric pressure, as in prior-art methods of creating tapered gate electrodes, the resulting polysilicon gate has the shape shown by the dashed line in FIG. 2. The angle is of course affected by the oxidation temperature and time, but in experiments performed by the inventor, normal-pressure oxidation created taper angles of 35° to 40°, giving cross-sectional areas of substantially 0.17 to 0.19 μm$^2$. High-pressure oxidation accordingly increases the sectional area of the gate electrode by about 10% to 20%, reducing the gate resistance by a like amount.

Figure 1F:
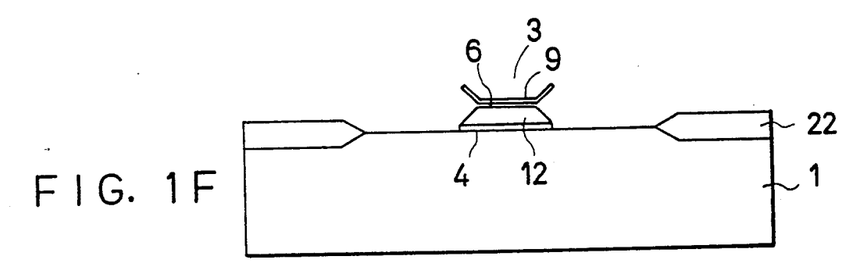

In the next step, illustrated in FIG. 1F, the oxide layers 10 and 11 are etched by substantially 8000 angstroms. In the element formation area 3, all oxide is removed excepting the gate oxide layer 4 directly beneath the gate electrode 12; thus the surface of the silicon substrate 1 is exposed on both sides of the gate electrode. Elsewhere, part of the oxide layer 11 is left as a field oxide layer 22 for isolation.

Figure 1G:
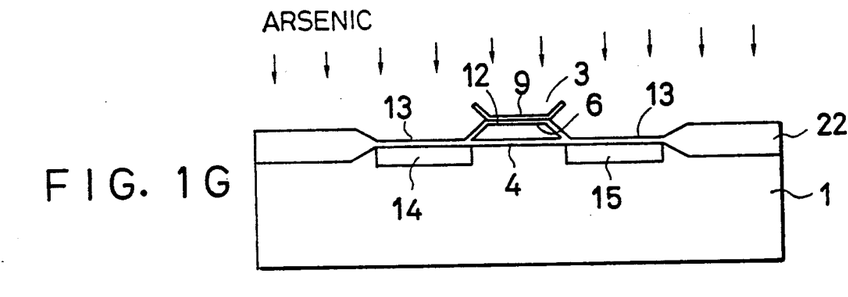

In the next step, illustrated in FIG. 1G, the surface of the silicon substrate 1 exposed on both sides of the gate electrode 12 is oxidized at substantially 900° C. in an oxygen atmosphere to form a protective oxide layer 13 substantially 200 angstroms thick, which also covers both sides of the polysilicon gate electrode 12. Arsenic ions are now implanted into the entire surface at an accelerating energy of 40 keV and dose of 1×10$^{16}$ ions/cm$^2$ to form a heavily-doped (n+) self-aligned source 14 and drain 15. The $Si_3N_4$ pattern 9, which is substantially 3000 angstroms thick, and the field oxide layer 22, which is substantially 6500 angstroms thick, function as a mask covering the gate and field areas, so that ions are implanted only into the source 14 and drain 15.

Figure 3:
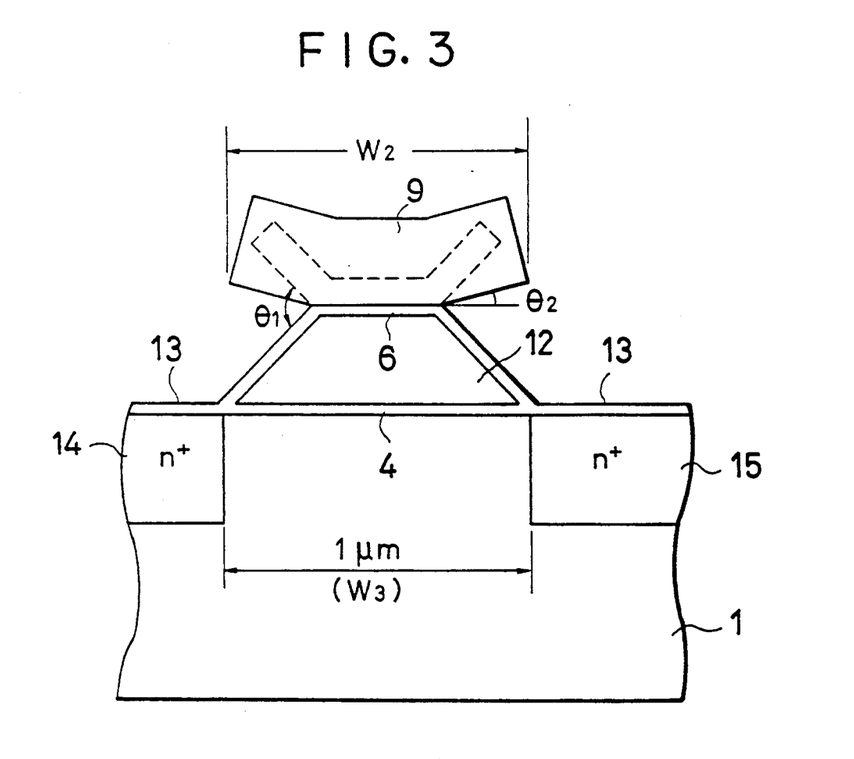
FIG. 3 is an enlarged sectional view illustrating the bird's-beak structure of the first embodiment.

Referring to FIG. 3, the angle of uplift of the Si$_3$N$_4$ pattern 9 that masks the gate region during the source/drain implant depends on the thickness of the Si$_3$N$_4$ pattern 9. When the Si$_3$N$_4$ pattern 9 is comparatively thin, the bird's-beak angle $\theta_1$ in FIG. 3 has been found to be substantially 80° to 85°, nearly a right angle, but when the Si$_3$N$_4$ pattern 9 has a thickness of substantially 3000 angstroms as in this embodiment, the uplift is considerably less, the angle $\theta_2$ in FIG. 3 being only about 5° to 10°.

The dimension W$_2$ of the Si$_3$N$_4$ pattern 9 that acts as an arsenic implantation mask is $$W_2 = 1.0 \ \mu m - 2 \times 0.3 \ \mu m + 2 \times 0.3 \cdot \cos(5° \text{ to } 10°) \ \mu m$$
$$= 0.998 \text{ to } 0.990 \ \mu m$$

which is substantially equal to 1.0 $\mu$m. The separation between the heavily-doped (n+) source and drain areas 14 and 15 in FIG. 3 is therefore substantially equal to the gate width (W$_3$), which is 1.0 $\mu$m.

Figure 1H:
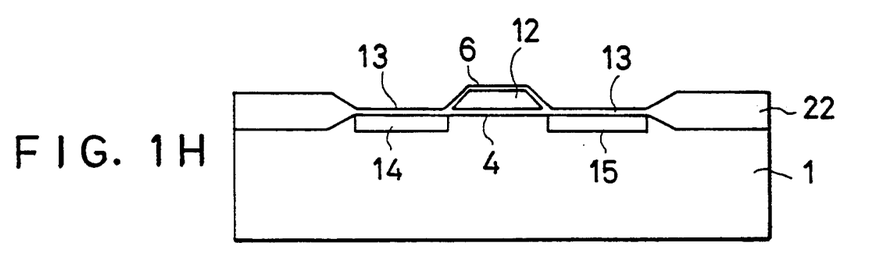

In the next step, illustrated in FIG. 1H, the Si$_3$N$_4$ pattern 9 is removed by etching with hot phosphoric acid.

Figure 1I:
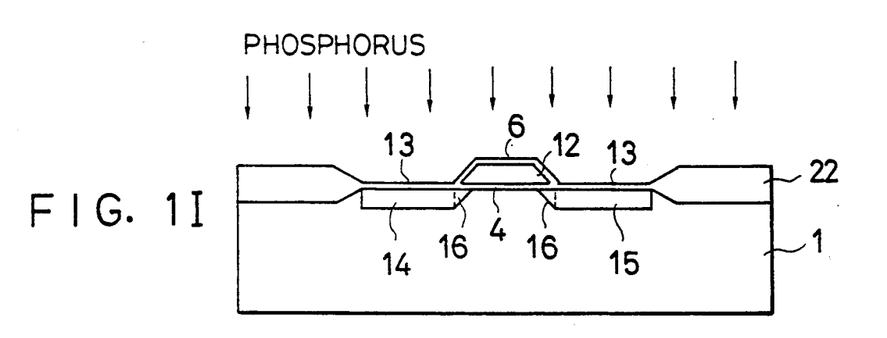

In the next step, illustrated in FIG. 1I, phosphorus is implanted at an accelerating energy of 100 keV and dose of 1.5×10$^{13}$ ions/cm$^2$ into the silicon substrate 1. The phosphorus ions penetrate not only into the source 14 and drain 15 but also through the tapered sides of the polysilicon gate electrode 12 and into the substrate below, forming lightly-doped (n−) offset areas 16 adjacent to the heavily-doped (n+) source 14 and drain 15. The amount of phosphorus implanted varies with the thickness of the taper, so the offset areas 16 have a graded doping profile, the doping being heaviest at the edges adjacent to the source 14 and drain 15 and gradually becoming lighter in a direction toward the center of the polysilicon gate 12.

Figure 4:
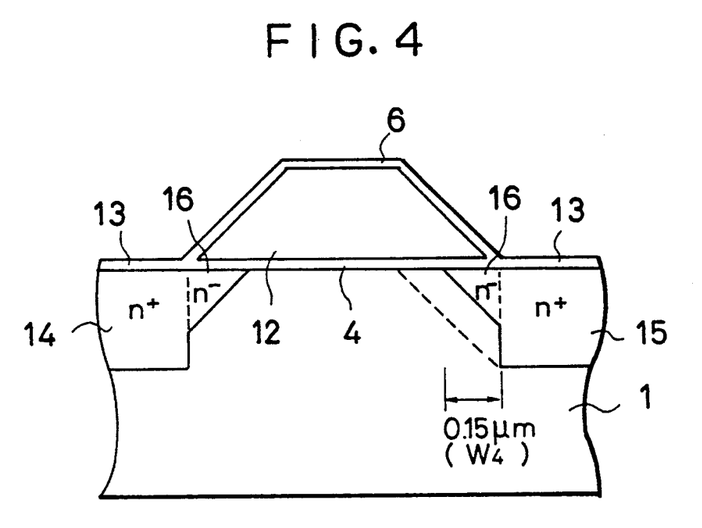
FIG. 4 is an enlarged sectional view illustrating the lightly-doped offset structure of the first embodiment.

With reference to the enlarged view in FIG. 4, when the accelerating energy is substantially 100 keV and the dose is 1.5×10$^{13}$ ions/cm$^2$, the n− offset layers 16 extend in from the outer edges of the polysilicon gate electrode 12 by substantially 0.15 $\mu$m, this dimension being marked W$_4$ in the drawing. W$_4$ depends on the ion accelerating energy and can be increased up to substantially the thickness of the polysilicon layer (0.3 $\mu$m), as indicated by the dashed line in FIG. 4, by raising the accelerating energy.

Figure 1J:
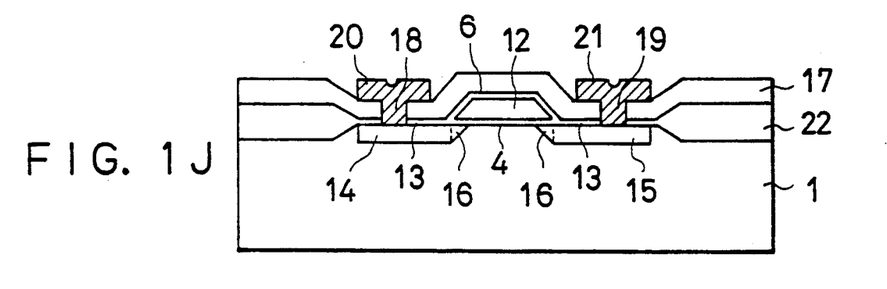

In the next step, illustrated in FIG. 1J, the entire surface is coated with a passivation layer of borophosphosilicate glass (BPSG) 17 substantially 7000 angstroms thick, contact holes 18 and 19 are opened for the source and drain, then a layer of metal such as aluminum is deposited by evaporation and patterned to form source and drain electrodes 20 and 21. This step completes the formation of an n-channel MOSFET with a lightly-doped drain structure in which the lightly-doped portion has a graded doping profile.

The advantages of the foregoing novel fabrication method can be listed as follows:

First, the novel method is capable of creating small-size transistors. The separation between the heavily-doped (n+) source 14 and drain 15 is substantially equal to the design rule, and is not increased by the presence of sidewalls. The novel method is also free of the short-channel effects that impose a lower limit on transistor size in double-diffused drain schemes.

Second, the novel method enables transistors to be packed relatively close together. This is because the heavily-doped (n+) source 14 and drain 15 are formed by a separate ion implantation step using a relatively low accelerating energy such as 40 keV, which results in a comparatively shallow junction depth. This feature, together with the small transistor size noted above, makes the novel method well adapted to the fabrication of densely integrated microelectronic circuits.

Third, when the offset areas 16 are doped, the ion dose can be optimized without significant effect on the properties of the heavily-doped source 14 and drain 15. As a result, not only are the transistors small in size, but their characteristics can be more easily controlled than in the prior art. For example, the dose can be adjusted to optimize the electric field intensity in in the lightly-doped offset areas 16. This is again a consequence of the use of two independent ion implantation steps: the heavily-doped source/drain implant masked by the Si$_3$N$_4$ pattern 9; and the much more lightly-doped offset implant performed after this Si$_3$N$_4$ mask is removed.

Figure 5:
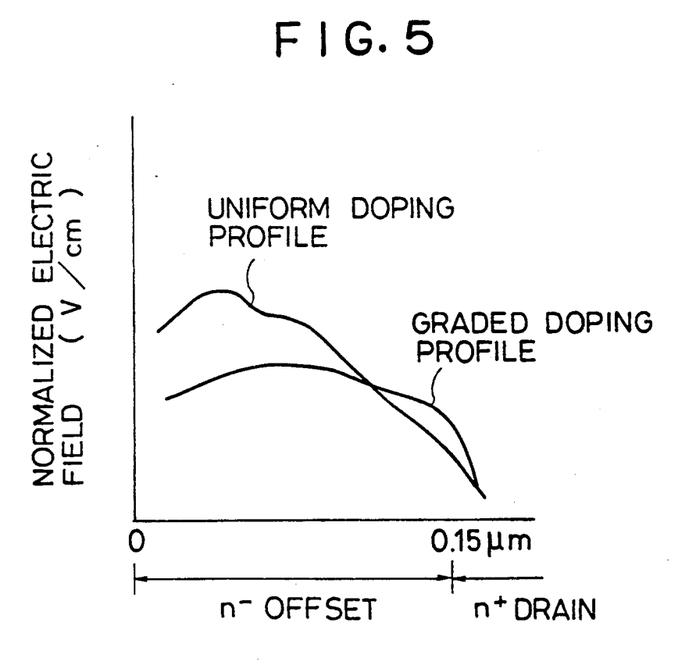
FIG. 5 is a graph illustrating simulated electric field strength for graded and uniform doping profiles.

Fourth, the doping can be adjusted so that the electric field does not peak in the offset areas 16. This is a consequence of the graded doping profile of the offset areas. Results of a simulation of the electric field intensity for graded and uniform offset doping profiles are shown in FIG. 5: field strength (V/cm) is indicated on the vertical axis; position ($\mu$m) is indicated on the horizontal axis. The doses have been adjusted so that both doping profiles give the same drain current. For the uniform doping profile, this dose results in a field intensity peak near the boundary between the offset and the channel that will produce hot carriers. With the graded doping profile the field intensity is more flat and generally lower; hot-carrier degradation can accordingly be avoided without sacrificing transistor performance.

Fifth, the lightly-doped drain structure and graded doping profile are attained with less increase in the resistance of the gate electrode than caused by prior-art methods not employing high-pressure oxidation, as noted in regard to FIG. 2.

Next an embodiment of the invention suitable for the fabrication of GOLD devices will described. First the prior-art GOLD fabrication method will be briefly explained with reference to FIGS. 6A to 6D.

Figure 6A:
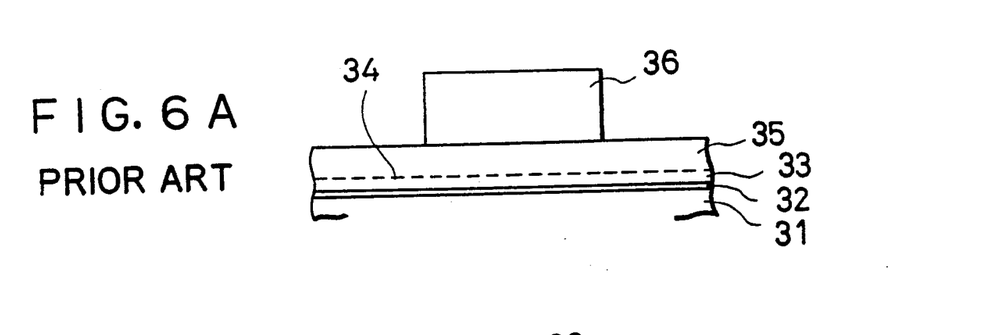
FIGS. 6A to 6D are sectional drawings illustrating steps in a prior-art GOLD process.

Referring to FIG. 6A, the prior-art GOLD method starts from a p-type silicon substrate 31 with a (100) crystal orientation, on which a gate oxide layer 32 approximately 150 angstroms thick is grown. A first polysilicon layer 33 approximately 500 angstroms thick is then deposited by low-pressure CVD and air-cured to produce a native oxide layer 34 about 5 to 10 angstroms thick. Next a second polysilicon layer 35 is deposited, followed by a CVD SiO$_2$ layer 36. The CVD SiO$_2$ layer 36 is patterned by photolithography so that it remains only over areas where a gate electrode will be formed.

Figure 6B:
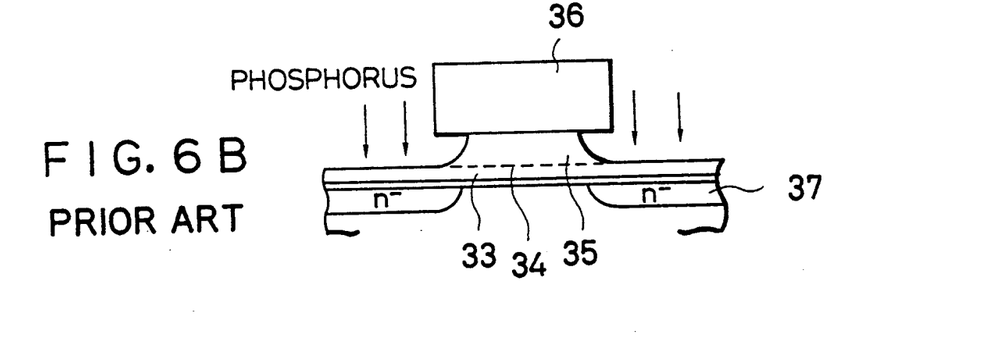

Referring to FIG. 6B, the second polysilicon layer 35 is now etched with the CVD SiO$_2$ layer 36 as a mask, using a dry etching process of high selectivity. The native oxide layer 34 acts as an etch stop so that, ideally at least, the first polysilicon layer 33 is left intact. Next phosphorus ions are implanted with an accelerating energy of 80 keV, again using the CVD SiO$_2$ layer 36 as a mask, to form a lightly-doped (n−) offset layer 37.

Figure 6C:
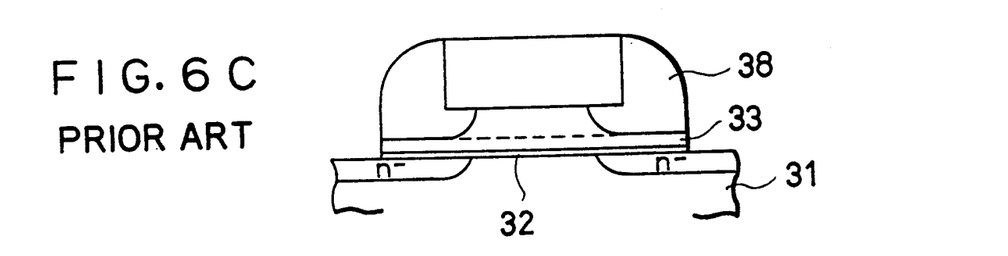

Referring to FIG. 6C, the entire surface is covered with another CVD SiO$_2$ layer which is etched by reactive ion etching to leave SiO$_2$ sidewalls 38. The first polysilicon layer 33 and the gate oxide layer 32 are also removed from areas outside the sidewalls 38.

Figure 6D:
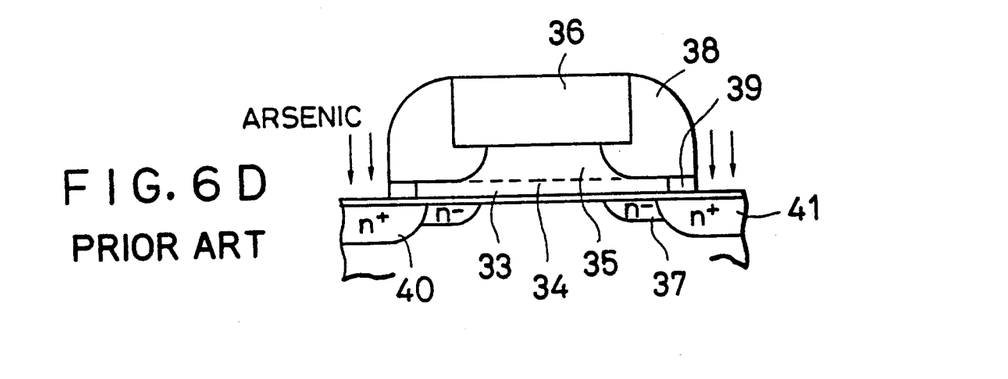

Referring to FIG. 6D, the first polysilicon layer 33 is now selectively oxidized to create sidewall oxides 39. This process is a wet oxidation process carried out at 800° C. by the well-known SELOCS (selective oxide coating of silicon gate) technique. It is followed by arsenic ion implantation with the CVD SiO$_2$ layer 36 and sidewalls 38 as a mask to form a heavily-doped (n+) source 40 and drain 41.

The gate electrode in the GOLD structure comprises both the first and second polysilicon layers 33 and 35. A merit of the GOLD structure is that the length of overlap between the gate electrode and the drain (including the lightly-doped offset area 37) can be optimized by controlling the size of the sidewall oxides 39; such control is held to be sufficiently accurate for use with design rules of 0.3 to 0.5 μm.

It is not easy, however, to etch the polysilicon gate electrode to the inverted T-shape shown FIG. 6B. To begin with, it is difficult to form a uniform native oxide layer 34; the thickness will tend to vary from place to place over the substrate 31. Where the native oxide layer 34 is too thick it will create unwanted electrical resistance within the polysilicon gate; in the extreme case, the two polysilicon layers will be electrically insulated from each other. Where the native oxide layer 34 is too thin, it will be an ineffective etch-stop, leading to unwanted etching of the first polysilicon layer 33.

Even assuming that it is possible to form a native oxide layer with the desired thickness of 5 to 10 angstroms, this is far less than the thickness of the second polysilicon layer 35. If the total gate thickness is 3000 to 4000 angstroms, as is customary for MOSFET gates, and the first polysilicon layer 33 is 500 angstroms thick as described above, the second polysilicon layer 35 has a thickness of 2500 to 3500 angstroms, exceeding the thickness of the native oxide layer 34 by a factor of 2500/10 to 3500/5, or 250 to 700. Dry etching apparatus with this degree of selectivity is not readily available, but if dry etching apparatus of ordinary selectivity is employed there will be many irregularities in layer thickness and overlap dimensions, which will lower the yield of the fabrication process.

Figure 7:
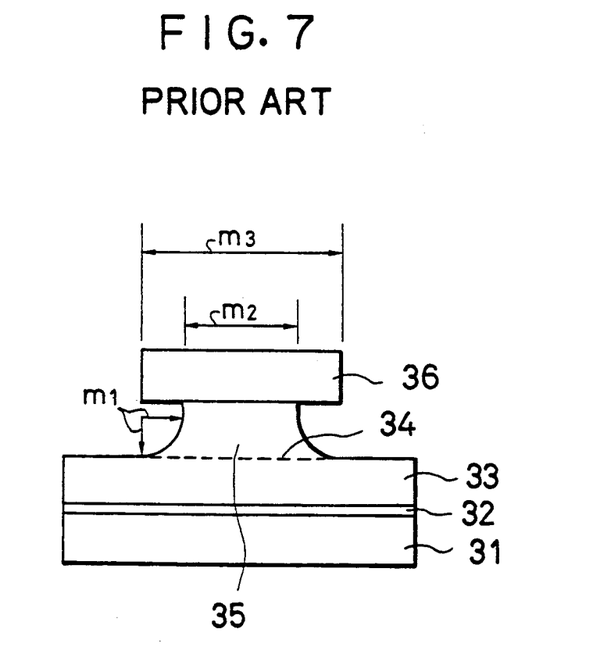
FIG. 7 is a sectional view for explanation of wet etching.

Wet etching, which has higher selectivity, might be employed instead, but wet etching is isotropic. Referring to FIG. 7, while the second polysilicon layer 35 is etched by an amount m$_1$ in the downward direction, it is etched laterally by a like amount m$_1$. If m$_3$ is the length of the CVD SiO$_2$ layer 36 and m$_2$ is the length of the second polysilicon layer 35 after etching at a level just under the CVD SiO$_2$ layer 36, then evidently m$_2$=m$_3$−(2×m$_1$). If the second polysilicon layer 35 is 2500 angstroms thick and the CVD SiO$_2$ layer 36 is 0.5 μm (5000 angstroms) in length, then m$_2$=5000−(2×2500)=0; the CVD SiO$_2$ layer 36 will be physically detached from the second polysilicon layer 35, which is of course unacceptable.

These problems are overcome in the second embodiment of the present invention, which will be described next with reference to FIGS. 8A to 8H.

Figure 8A:
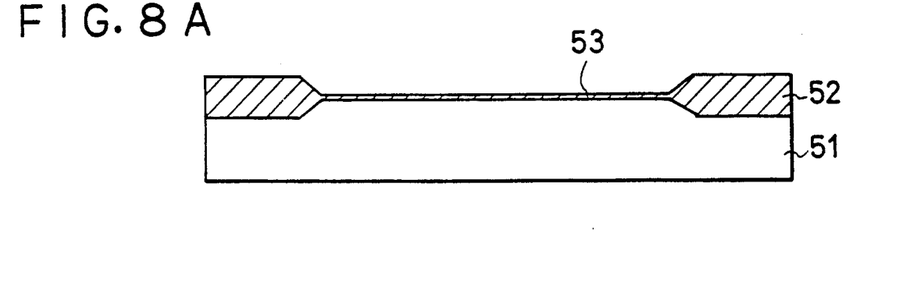
FIGS. 8A to 8H are sectional drawings illustrating steps in a second embodiment of the invention.

The first step, illustrated in FIG. 8A, is the local oxidation of a p-type silicon substrate 51 with the (100) crystal orientation, having a resistivity of 1 to 2 Ω·cm, to form a SiO$_2$ field oxide layer 52 substantially 7000 angstroms thick. After this, a gate oxide layer 53 substantially 200 angstroms thick is formed on the surface of the element formation area by heat treatment at substantially 850° C. in a wet atmosphere for 30 minutes.

Figure 8B:
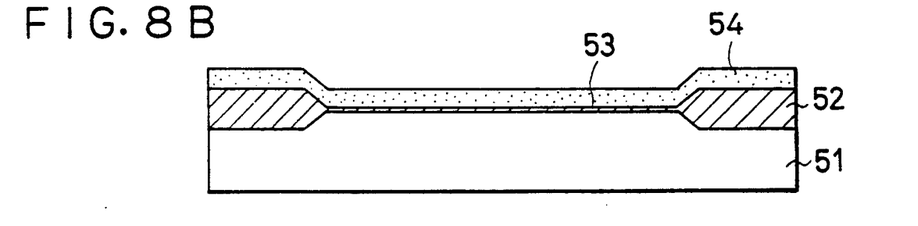

In the next step, illustrated in FIG. 8B, a polysilicon layer 54 substantially 3000 angstroms thick is formed by low-pressure CVD on the entire surface. On a six-inch wafer it has been found possible to control the thickness of the polysilicon layer 54 with an accuracy of ±5%, or ±150 angstroms.

Figure 8C:
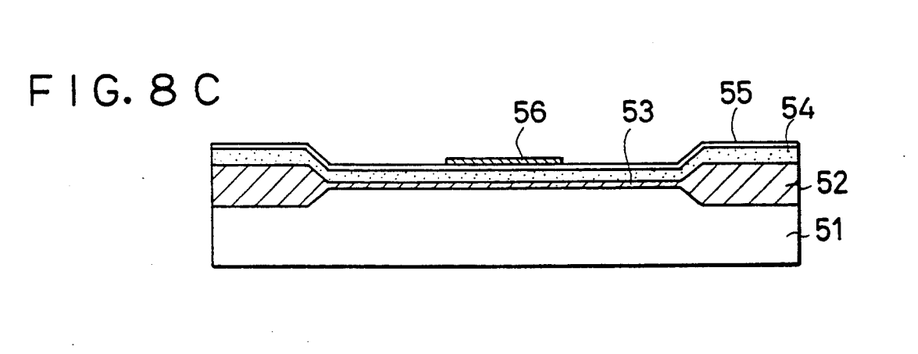

In the next step, illustrated in FIG. 8C, an oxide layer 55 substantially 200 angstroms thick is grown on the polysilicon layer 54 in a dry atmosphere at 900° C. for 30 minutes. Then an oxidation-resistant layer such as an Si$_3$N$_4$ layer 1500 angstroms thick is formed by low-pressure CVD and patterned by photolithography to leave an Si$_3$N$_4$ pattern 56 over what will become the gate electrode.

Figure 8D:
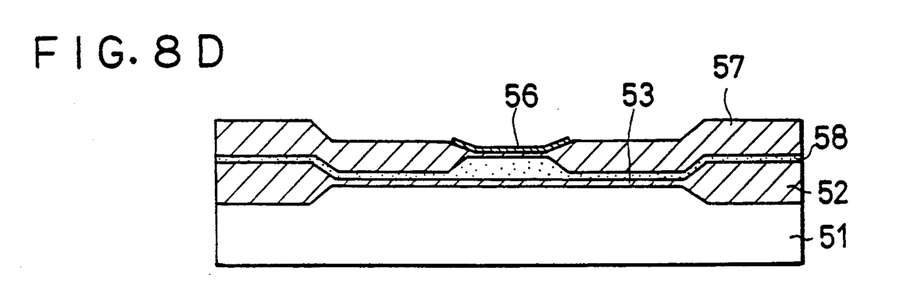

In the next step, illustrated in FIG. 8D, high-pressure oxidation is carried out at a pressure of substantially seven atmospheres (7 kg/cm$^2$) and temperature of 1030° C. for fifteen minutes in a wet oxygen atmosphere to form an oxide layer 57 substantially 4700 angstroms thick. A remaining polysilicon layer 58 is left below the oxide layer 57.

High-temperature oxidation processes are generally easier to control than etching processes; the thickness of the oxide layer 57 can be controlled within ±2%, or ±100 angstroms. If it is assumed that oxidation of polysilicon causes a thickness change in the ratio 1:2, the thickness of the polysilicon that is oxidized to form the oxide layer 57 is 2350 ±50 angstroms. Since the original thickness of the polysilicon layer 54 was 3000 ±150 angstroms, the thickness of the remaining polysilicon layer 58 is within the following limits:

Maximum: (3000+150)−(2350−50)=850 angstroms

Minimum: (3000−150)−(2350+50)=450 angstroms

The remaining polysilicon layer 58 accordingly has a thickness of 650 ±200 angstroms.

Figure 8E:
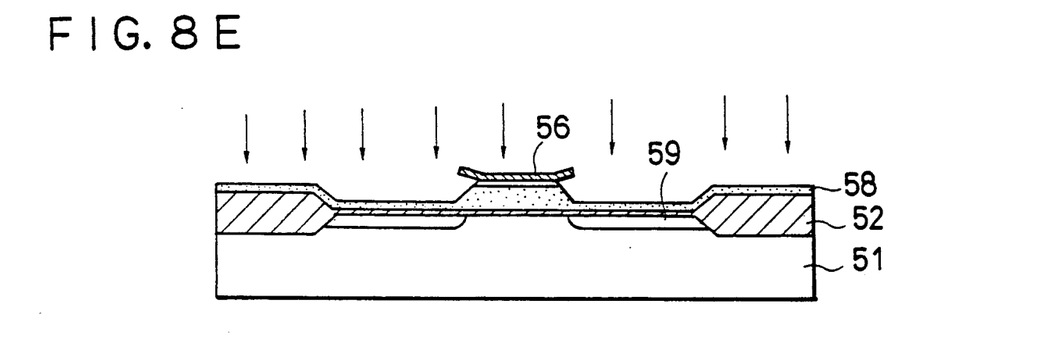

In the next step, illustrated in FIG. 8E, the oxide layer 57 is removed by etching, then arsenic is implanted at an accelerating energy of 60 keV and dose of 2.0×10$^{13}$ ions/cm$^2$ to form a lightly-doped (n−) offset layer 59. The implantation is masked by the Si$_3$N$_4$ pattern 56.

Instead of arsenic, phosphorus may be implanted.

Figure 9:
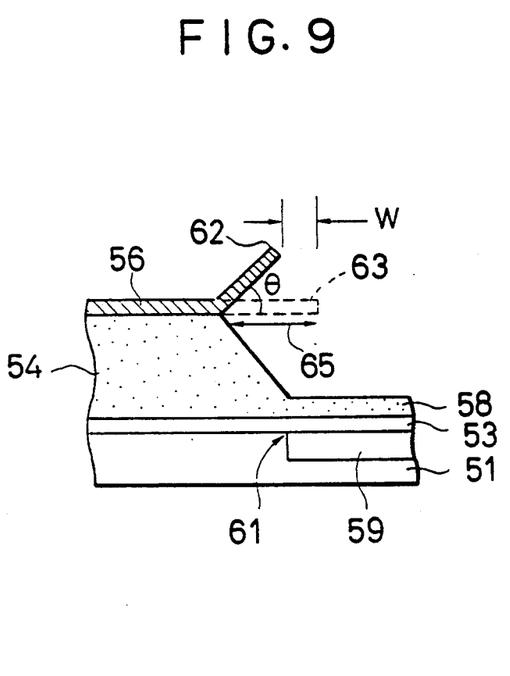
FIG. 9 is an enlarged sectional view illustrating the bird's-beak structure of the second embodiment.

Referring to the enlarged view in FIG. 9, the edge 61 of the offset layer 59 is aligned with the edge 62 of the Si$_3$N$_4$ pattern 56. As in the first embodiment of the invention, high-pressure oxidation raises the edge 62 of the Si$_3$N$_4$ pattern 56 from its original position 63 by an angle $\theta$. In the second embodiment, in which the Si$_3$N$_4$ pattern 56 is 1500 angstroms thick, the angle $\theta$ is approximately 30° to 45°. (The smaller angle of 5° to 10° in the first embodiment was due to the greater thickness of the Si$_3$N$_4$ layer.) The edge 62 of the Si$_3$N$_4$ pattern 56 is thus displaced inward by an amount W. If the length of the bird's-beak 65 is 0.2 μm, then the dimension W is:

$$W = 0.2 - 0.2 \times \cos\theta \ (\theta = 45°)$$
$$= 0.06 \ \mu m$$

Figure 8F:
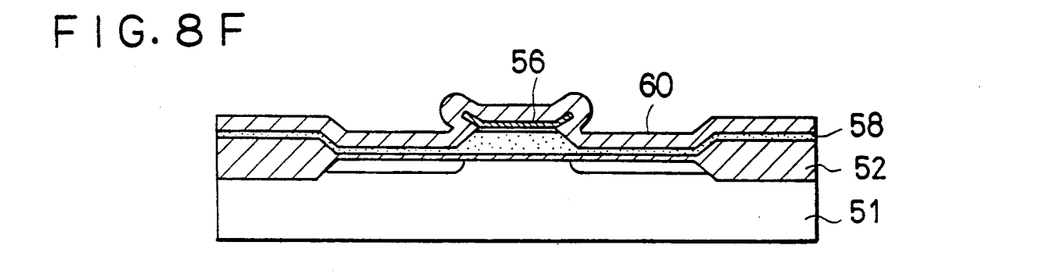

In the next step, illustrated in FIG. 8F, a layer of oxide (SiO$_2$) 60 substantially 4000 angstroms thick is grown over the entire surface by CVD.

Figure 8G:
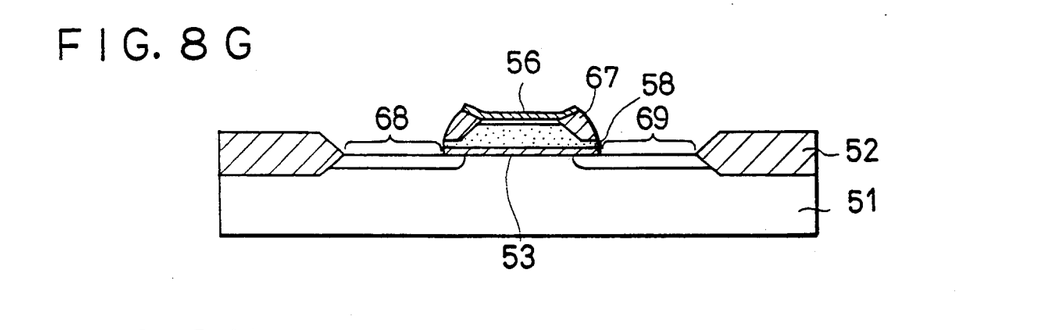

In the next step, illustrated in FIG. 8G, this layer of SiO$_2$ 60 is etched by the reactive ion etching method, using the Si$_3$N$_4$ pattern 56 as a mask, thus forming SiO$_2$ sidewalls 67. The remaining polysilicon layer 58 and gate oxide 53 are left intact beneath the sidewalls 67, but are removed from areas outside the sidewalls 67 to expose source and drain formation regions 68 and 69.

Figure 8H:
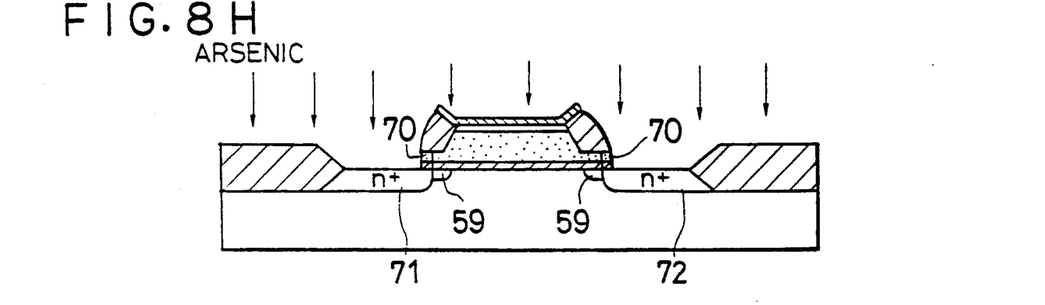

In the next step, illustrated in FIG. 8H, the same SELOCS process as in the prior art is used to create sidewall oxides 70, thereby adjusting the length of the gate-drain overlap, and arsenic ions are implanted at an accelerating energy of 40 keV and dose of $1 \times 10^{16}$ ions/cm$^2$ with the Si$_3$N$_4$ pattern 56 and sidewalls 67 as a mask to create a heavily-doped source 71 and drain 72. Finally, a passivation layer and source and drain electrodes can be added as in FIG. 1J to complete the formation of an n-channel MOSFET with a GOLD structure.

The advantages of the second embodiment over the prior-art GOLD process can be listed as follows:

First, there is no native oxide layer to create unwanted electrical resistance within the polysilicon gate.

Second, the thickness of the polysilicon gate can be accurately and reliably controlled. The total thickness can be controlled with an accuracy of ±150 angstroms, the thickness of the part removed by oxidation with an accuracy of ±50 angstroms, and the thickness of the remaining part, corresponding to the first polysilicon layer 33 in FIGS. 6A to 6D, with an accuracy of ±200 angstroms.

Third, since the lightly-doped offset layers 59 are displaced by the amount W in FIG. 9 toward the center of the transistor, the total length of the gate structure can be reduced by 2 W. In a typical case the length can be reduced by $2 \times 0.06 = 0.12$ $\mu$m, a significant reduction with submicron design rules.

The preceding embodiments can be modified in various ways that will be apparent to one skilled in the art without departing from the scope of the invention as set forth in the following claims.

What is claimed is:

1. A MOSFET fabrication process comprising steps of:
   (a) forming a gate oxide layer on a semiconductor substrate;
   (b) depositing a polysilicon layer over said gate oxide layer;
   (c) forming an oxidation-resistant layer over said polysilicon layer;
   (d) patterning said oxidation-resistant layer to define a gate electrode formation area;
   (e) performing high-pressure oxidation, thereby oxidizing all of said polysilicon layer not covered by said oxidation-resistant layer and a bird's-beak-shaped portion of the polysilicon layer covered by the oxidation-resistant layer, thus leaving, under said oxidation-resistant layer, a polysilicon gate electrode with tapered sides;
   (f) removing all oxidized portions of said polysilicon layer;
   (g) implanting first impurity ions at a first accelerating energy and first dose, with said oxidation-resistant layer as a mask;
   (h) removing said oxidation-resistant layer, and;
   (i) implanting second impurity ions at a second accelerating energy higher than said first accelerating energy and second dose lower than said first dose.

2. The process of claim 1, wherein step (e) is performed at a pressure of at least about seven atmospheres.

3. The process of claim 1, wherein step (e) is performed in a wet oxygen atmosphere at a temperature of not less than 950° C.

4. The process of claim 1, wherein said oxidation-resistant layer comprises Si$_3$N$_4$.

5. The process of claim 1, wherein said oxidation-resistant layer is sufficiently thick that oxidation in step (e) raises edges of said oxidation-resistant layer by an angle not exceeding 10°.

6. The process of claim 1, wherein said first impurity ions are phosphorus ions and said second impurity ions are arsenic ions.

7. A MOSFET fabrication process comprising steps of:
   (a) forming a gate oxide layer on a semiconductor substrate;
   (b) depositing a polysilicon layer over said gate oxide layer;
   (c) forming an oxidation-resistant layer over said polysilicon layer;
   (d) patterning said oxidation-resistant layer to define a gate electrode formation area;
   (e) performing high-pressure oxidation, thereby oxidizing an upper part of said polysilicon layer not covered by said oxidation-resistant layer and a bird's-beak-shaped portion of the polysilicon layer covered by the oxidation-resistant layer, thus leaving, under said oxidation-resistant layer, a polysilicon gate electrode with tapered sides surrounded by a remaining polysilicon layer;
   (f) removing the oxidized upper part of said polysilicon layer;
   (g) implanting first impurity ions at a first accelerating energy and first dose with said oxidation-resistant layer as a mask;
   (h) depositing a layer of oxide over all exposed surfaces;
   (i) etching said layer of oxide by reactive ion etching with said oxidation-resistant layer as a mask, thus leaving sidewalls adjacent to said tapered sides of said polysilicon gate electrode, also leaving said remaining polysilicon layer and said gate oxide layer intact below said sidewalls; and
   (j) implanting second impurity ions at a second accelerating energy lower than said first accelerating energy and second dose higher than said first dose with said oxidation-resistant layer and said sidewalls as a mask.

8. The process of claim 7, wherein step (e) is performed at a pressure of at least about seven atmospheres.

9. The process of claim 7, wherein step (e) is performed in a wet oxygen atmosphere at a temperature of not less than 1030° C.

10. The process of claim 7, wherein said first impurity ions are implanted partially below said tapered sides of said polysilicon gate electrode.

11. The process of claim 7, wherein said oxidation-resistant layer comprises Si$_3$N$_4$.

12. The process of claim 7, wherein said oxidation-resistant layer is sufficiently thin that oxidation in step (e) raises edges of said oxidation-resistant layer by an angle of at least about 40°.

13. The process of claim 7, wherein said first impurity ions are arsenic ions or phosphorus ions and said second impurity ions are arsenic ions.

* * * * *